United States Patent [11] 3,614,777

[72] Inventor Roy P. Foerster
Thousand Oaks, Calif.
[21] Appl. No. 831,467
[22] Filed June 9, 1969
[45] Patented Oct. 19, 1971
[73] Assignee The Bunker-Ramo Corporation
Oak Brook, Ill.
Continuation-in-part of application Ser. No. 645,191, June 12, 1967.

[54] ANALOG-TO-DIGITAL CONVERTER
11 Claims, 9 Drawing Figs.

[52] U.S. Cl. 340/347 AD
[51] Int. Cl. H03k 13/06
[50] Field of Search 340/347

[56] References Cited

UNITED STATES PATENTS

| | | | |
|---|---|---|---|
| 3,188,624 | 6/1965 | McMillian | 340/347 |
| 3,259,896 | 7/1966 | Pan | 340/347 |
| 3,021,517 | 2/1962 | Kanehl | 340/347 |
| 3,467,958 | 9/1969 | McKinney | 340/347 |
| 3,484,779 | 12/1969 | Kiyasu | 340/347 |

*Primary Examiner*—Maynard R. Wilbur
*Assistant Examiner*—Jeremiah Glassman
*Attorney*—Frederick M. Arbuckle

ABSTRACT: A converter system employing clock controlled data propagation for rapidly converting analog input signals to "reflected binary" or Gray code output signals. The system is comprised of a plurality of substantially identical stages, each capable of providing both a bit output signal and a residual analog output signal in response to an analog input signal. Each stage alternately operates in an "acquisition" mode in which the input portion of the stage slews to, and tracks, the stage input voltage and a "hold" mode in which the stage input portion stops tracking and holds constant at the level of the input signal immediately prior to the start of the hold command. The stages are interconnected in a manner which permits each stage to start converting a subsequent analog input signal promptly after it forms its bit with respect to the preceding analog input signal and prior to propagation of the preceding analog input signal through all of the stages.

*INVENTOR.*
ROY P. FOERSTER

*BY* Lindenberg & Freilich

ATTORNEYS

INVENTOR.
ROY P. FOERSTER

BY Lindenberg & Freilich

ATTORNEYS

INVENTOR.
ROY P. FOERSTER

BY Lindenberg & Freilich

ATTORNEYS

INVENTOR.
ROY P. FOERSTER
BY Lindenberg + Freilich
ATTORNEYS

ANALOG-TO-DIGITAL CONVERTER

ANALOG-TO-DIGITAL CONVERTER

This application is a continuation-in-part application of U.S. Pat. application Ser. No. 645,191 filed June 12, 1967 by Roy P. Foerster, and assigned to the same assignee as the present application.

BACKGROUND OF THE INVENTION

1. Field of the Invention

This invention relates generally to analog-to-digital converters.

2. Description of the Prior Art

Analog-to-digital converters are normally speed limited by the time it takes for the signal to propagate through the converter stages. In conventional converters the maximum output word rate is established by the time it takes for an analog input signal to be sent through all of the converter stages, each stage generating a different bit of the digital output word. This use of the converter stages is inefficient because once a stage has made its bit decision and generated an analog residue for the succeeding stage, it has nothing to do until the next analog input signal is applied and the stage is called upon to provide its bit.

SUMMARY OF THE INVENTION

The present invention is based on the recognition that the duty cycle of each stage in a multistage converter can be maximized to permit each stage to start working on a succeeding analog input word as soon as it is through processing the preceding input word. In this manner, a converter can be processing successive input words during the time it takes for one complete word to propagate through the converter stages. This approach yields a great increase in the digital output word rate of the converter because now the word rate is limited only by the time it takes for a single stage to generate a bit. The output bits are, of course, made available in time sequence and must be assembled, but this is a digital operation and can be accomplished quite fast.

A converter in accordance with the invention can be considered as being comprised of a converting portion and an assembling portion. The converting portion is comprised of a plurality of interconnected substantially identical converter stages utilized in a manner which causes data to be propagated from each stage to a succeeding stage in time sequence, under the control of a clock pulse source.

In a preferred embodiment of the invention, the converting portion includes two converter stages for each bit of resolution desired. Thus, for example, in order to convert to a five-bit resolution, the converting portion will employ 10 converter stages.

The converter stages are identical and have two modes of operation. One mode is the "acquisition" mode, in which the input portion of the stage slews to, and tracks, the input voltage applied to the stage. The other mode is the "hold" mode, in which the input portion of the stage stops tracking and holds constant at whatever level it had immediately prior to the start of the hold command. The level of this held signal is sensed to quantize the output digit. The output portion of the stage functions to develop an analog residue signal for application to a succeeding stage.

In operation, the stages producing bits of the same significance are alternately operated in the acquisition and hold modes. That is, when one stage is in the hold mode producing an output bit, the other stage of the same bit significance is acquiring the level of the succeeding analog input word.

The assembling portion of the converter comprises shift registers which form the digital output words corresponding to successive analog input words by delaying the bits as they are produced until all of the bits of an output word are available. Digital output words will thus be provided at a rate determined by the clock pulse frequency which is limited only by the conversion speed of a single stage.

In an alternative embodiment of the invention, in lieu of increasing the duty cycle of each stage in a multistage converter for the purpose of increasing the output data rate, the number of stages is reduced with the stages being operated at a higher duty cycle for the purpose of maintaining a desired output data rate with a minimum amount of hardware.

More particularly, in an alternative embodiment of the invention, the residual output of a single converter stage is coupled to a sample and hold circuit which subsequently supplies the residual output to the stage input. Thus the single stage can successively produce output data bits at a rate determined by the stage speed. In order to somewhat increase output data rate with a slight increase in hardware, first and second converter stages are used with a sample and hold circuit coupling the residual output of each stage to the input of the other stage. In this latter configuration, the stages alternately provide output data bits.

Figure 1:
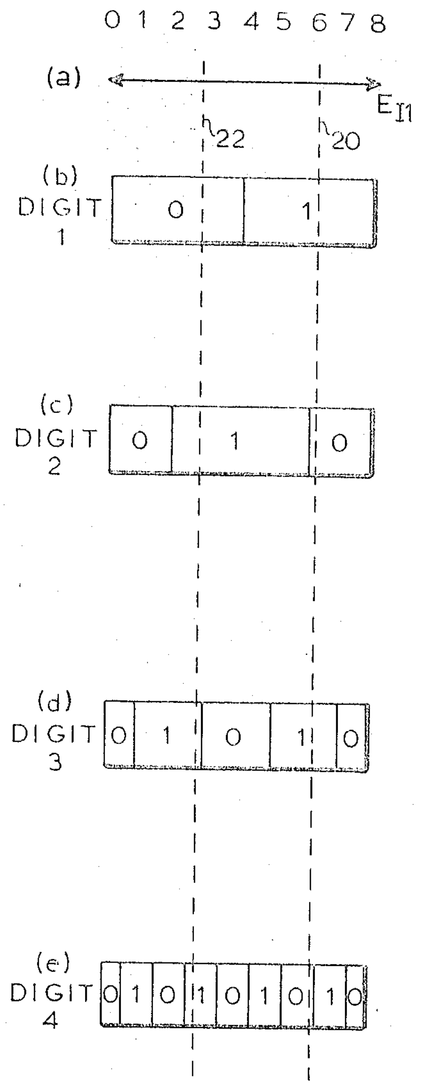
FIG. 1 comprises a diagram illustrating the Gray code representation of an analog quantity.

Attention is now called to FIG. 1, which illustrates the manner in which a four-digit reflected binary code group can represent various levels of an analog signal. Note that line (*a*) of FIG. 1 represents an analog input signal $E_{i1}$ whose level will be assumed to lie in a range between 0 and 8 units (e.g., volts). Lines (*b*), (*c*), (*d*), and (*e*) of FIG. 1 respectively define the states of the four digits of a reflected binary code group for any value of input signal. If should be appreciated that utilization of four digits enables the range of the input signal $E_{i1}$ to be quantized into 16 different levels, each level being represented by a different code group. In order to determine the reflected binary code group representative of any level of input signal $E_{i1}$, it is merely necessary to locate that level on line (*a*), and sight down the diagram reading off the four digits in lines (*b*), (*c*), (*d*), and (*e*). For example, consider that the input signal $E_{i1}$ defines a level 6.2 on the indicated scale 0–8. By sighting down FIG. 1 along the dashed line 20, it will be apparent that the analog level 6.2 will be represented by the reflected binary code 1010. As a further example, an analog input signal having a level 2.8 will be represented by the reflected binary code group 0111 as indicated by dashed line 22.

Figure 3:
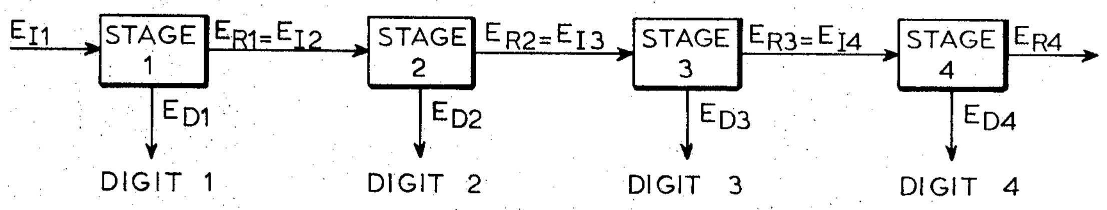
FIG. 3 is a block diagram illustrating a converter formed by connecting several stages in tandem.
Figure 4:
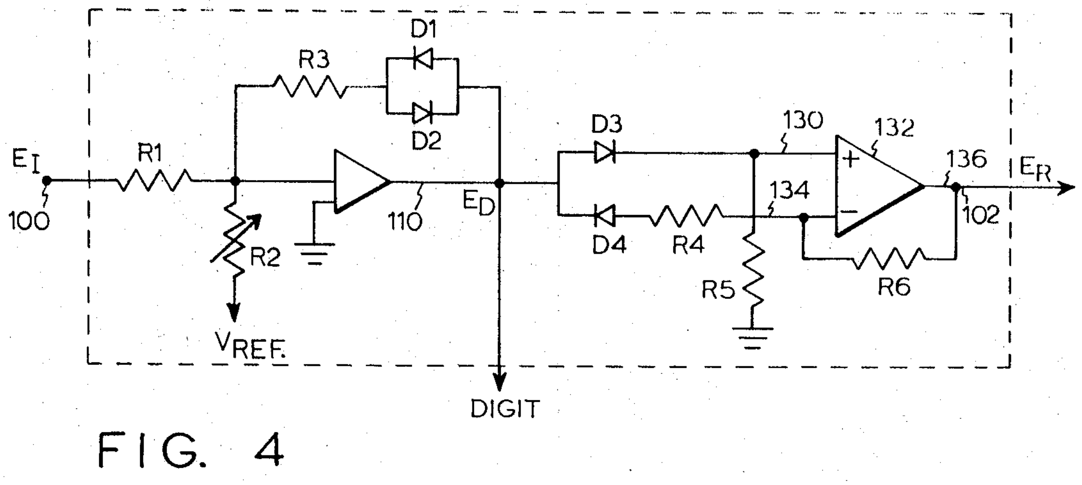
FIG. 4 is a circuit diagram illustrating an embodiment of a stage useful in the converter of the aforementioned patent application.
Figure 6:
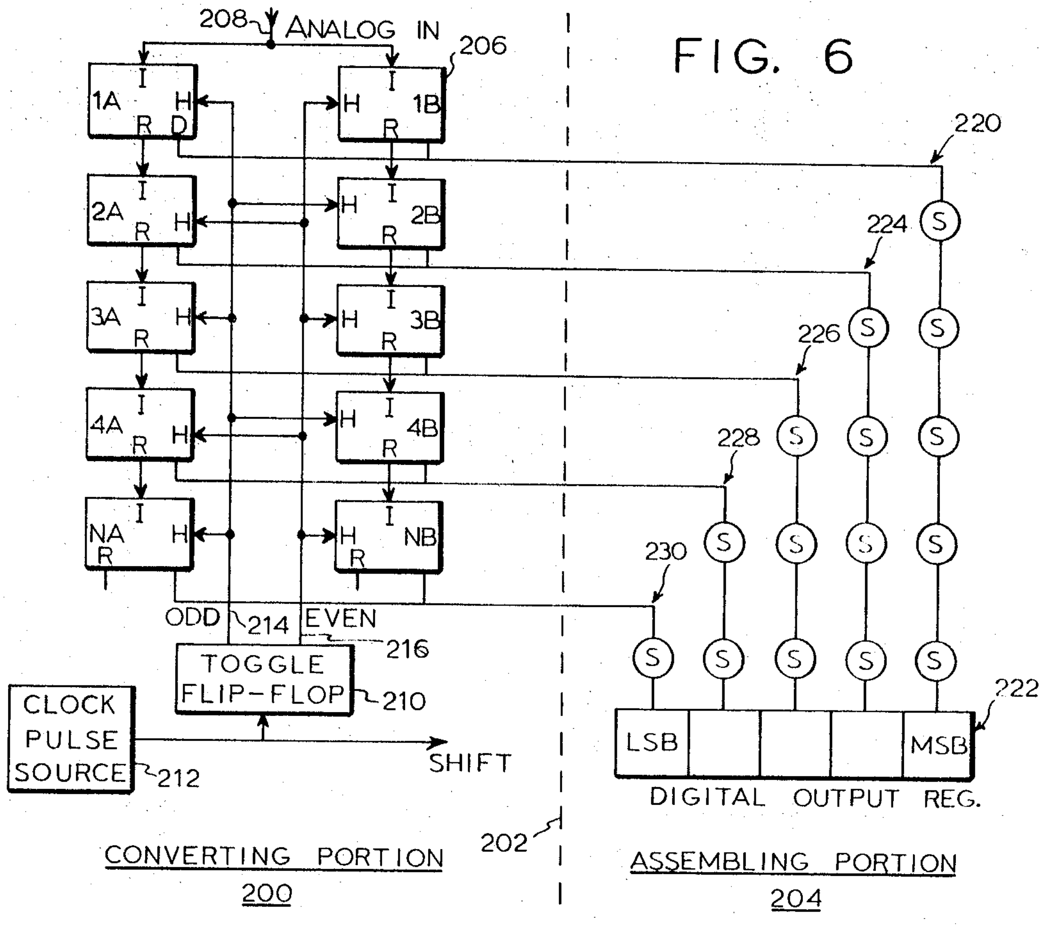
FIG. 6 is a block diagram of a time sequenced analog-to-digital converter in accordance with the present invention.
Figure 7:
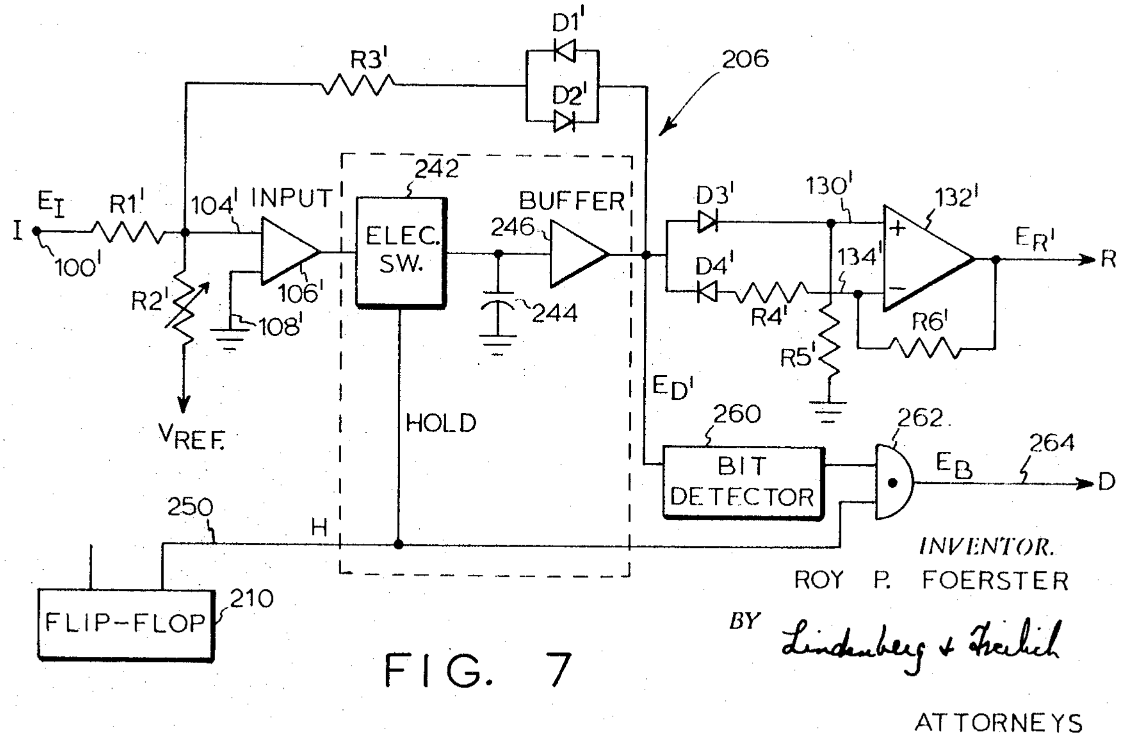
FIG. 7 is a circuit diagram depicting a converter stage in accordance with the present invention useful in the converter of FIG. 6.

The parent of the present continuation-in-part application discloses an apparatus capable of converting an analog input signal as represented by line (*a*) of FIG. 1 to a corresponding set of reflected binary digits. The apparatus of the parent application is illustrated in FIGS. 3 and 4 hereof. The improvements in accordance with the present invention which enable the digital data output rate to be substantially increased are best illustrated in FIGS. 6 and 7.

As taught in the parent application, in order to convert an analog signal level into a reflected binary code group, a plurality of substantially identical stages (stage 1, stage 2, stage 3, and stage 4) can be connected in cascade as shown in FIG. 3. Each of the stages typified by block 24 is provided with an analog input terminal 26, a digit signal output terminal 28, and a residual analog signal output terminal 30. The analog signal $E_{I1}$ to be converted is applied to the input terminal 26 of the first stage. The output terminal 30 of each stage is connected to the input terminal 26 of a subsequent stage. Thus, the residual analog output signal developed by each stage is applied as the analog input signal to a succeeding stage. The residual analog output signal developed by stage 1 is designated $E_{R1}$. The digital output signal developed by stage 1 on terminal 28 is designated as $E_{D1}$.

Figure 2:
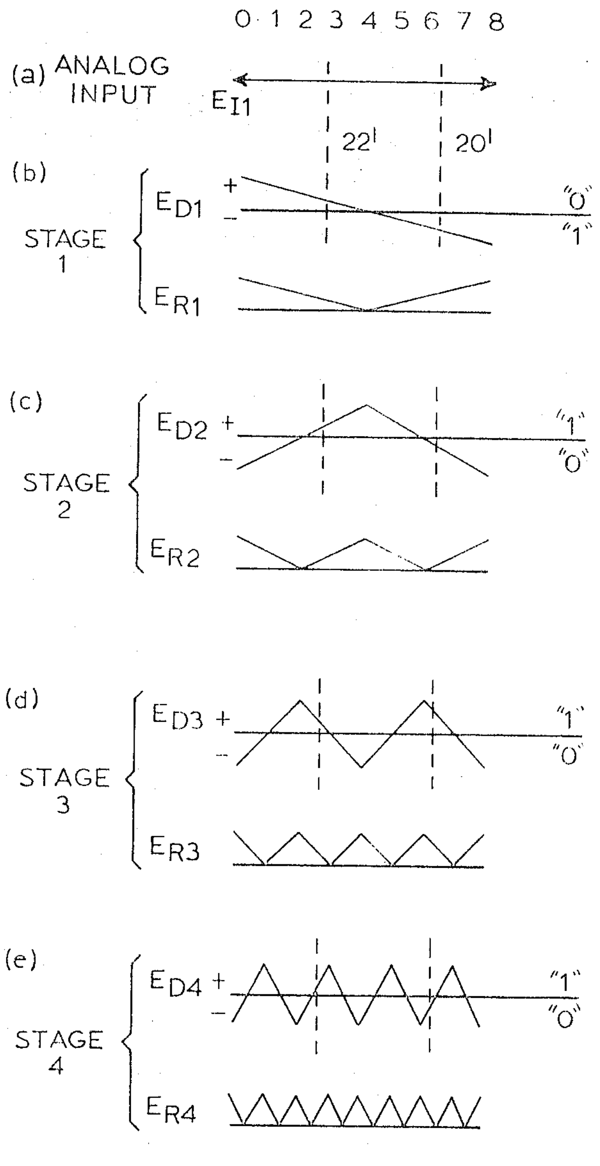
FIG. 2 comprises a diagram similar to FIG. 1 illustrating required stage transfer characteristics for developing digital output and residual output signals for converting an analog input signal to a reflected binary code.

FIG. 2 demonstrates how the converter of FIG. 3 functions to convert analog input signal levels to reflected binary code signals. Line (*a*) of FIG. 2 is identical to line (*a*) of FIG. 1 and represents the analog input signal range. Line (*b*) of FIG. 2 illustrates the transfer characteristics of stage 1 showing the values of the digit output and residual output signals $E_{D1}$ and $E_{R1}$ for the various levels of analog input signal. Line (*c*) of FIG. 2 illustrates the transfer characteristics of stage 2 of FIG. 3 showing the values of signals $E_{D2}$ and $E_{R2}$ produced by stage 2 in response to the application of signal $E_{R1}$ thereto. Similarly, lines (*d*) and (*e*) of FIG. 2 respectively illustrate the transfer characteristics of stages 3 and 4 of FIG. 3.

It will be noted that the digit signal characteristics illustrated in lines (*b*), (*c*), (*d*), and (*e*) of FIG. 2 define crossover points corresponding to the state changes in the diagram of FIG. 1. Thus, the line (*b*) of FIG. 2, for example, the signal $E_{D1}$ is positive for the first half of the range of input signal $E_{I1}$ and is negative for the second half of the input signal range. This corresponds to digit 1 represented in FIG. 1 as constituting a "0" for the first half of the input signal range and constituting a "1" for the second half of the input signal range. Note that for signal $E_{D1}$ a positive polarity represents a binary "0" and a negative polarity represents a binary "1." For subsequent stages, a positive value of the digit signal represents a binary "1" and negative values represent a binary "0." For example, note line (*c*) of FIG. 2 in which the signal $E_{D2}$ is negative for the first and last quarters of the input signal range and positive therebetween. This corresponds to digit 2 in FIG. 1 which is "0" for the first and last quarters of the input signal range and "1" therebetween.

FIG. 2 illustrates by dotted lines 20' and 22' the conversion of input signal levels 6.2 and 2.8 respectively represented by the dotted lines 20 and 22 in FIG. 1. Note that for the value 6.2 represented by dotted line 20', the stages 1–4 of FIG. 3 will respectively provide the digits 1010 which correspond to the code group indicated for this input signal value indicated in FIG. 1. Similarly, the input signal level 2.8 will cause stages 1–4 of FIG. 3 to respectively provide binary signals 0111 which correspond to the representation indicated in FIG. 1.

From what has been said thus far, it should now be appreciated that by defining the transfer characteristics shown in FIG. 2, the converter of FIG. 3 will provide reflected binary code signals in response to an input analog signal. It should be realized that the transfer characteristics represented in FIG. 2 are identical for all of the stages. More particularly, it will be noted that stage 1, for example, responds to the range of input signal $E_{I1}$ to provide an output signal $E_{D1}$ having a range which intersects 0 or ground potential at the midpoint of the input signal range. It can be assumed, for example, that the range of input signal $E_{I1}$ is 0 to 8 volts. The signal $E_{D1}$ can have a range which extends, for example, from +8 volts to −8 volts. Thus, when the input signal $E_{I1}$ defines a level of +4 volts, the signal $E_{D1}$ will be at ground potential. The residual signal $E_{R1}$ can be considered as constituting the signal $E_{D1}$ except that the negative half of the range of signal $E_{D1}$ is inverted. Thus, for example, signal $E_{R1}$ can have a range from 0 to +8 volts. When the signal $E_{D1}$ is at either +8 or −8 volts, the signal $E_{R1}$ will be at +8 volts. When the signal $E_{D1}$ is at ground potential the signal $E_{R1}$ will be at ground potential.

It should be appreciated that stage 1 must define a V-shaped transfer characteristic in order to provide the signal $E_{R1}$ shown in FIG. 2 in response to the input signal $E_{I1}$. The V-shaped characteristic must be symmetrical about the midpoint of the input signal range. Stages 2, 3, and 4 can be identical to stage 1 and define the same characteristic. Thus, stage 2 will provide signal $E_{D2}$ from signal $E_{R1}$ by inverting signal $E_{R1}$, amplifying it, and increasing its midpoint to some positive level, e.g., +8 volts.

FIG. 4 illustrates the converter stage of the present application useful in the converter of FIG. 3. The stage includes an input terminal 100 and an output terminal I The stage input terminal 100 is connected D a resistor R1 to a first input terminal 104 of an amplifier 106. A second input terminal 108 is grounded. The input terminal I1 is connected through a trimming resistor R2 to a source of reference voltage. First and second feedback paths are provided between D1 output terminal 110 and input terminal 104. More particularly, one path is defined by diode D1 connected in series with resistor R3. A second path is defined by diode D2 connected in series with resistor R3. Diodes D1 and D2 are oppositely poled and connected in parallel.

Figure 5:
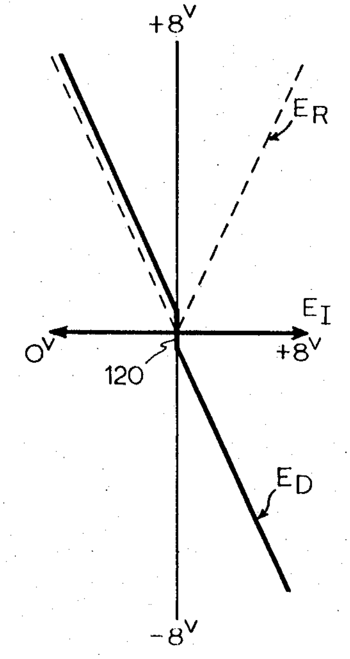
FIG. 5 is a diagram illustrating the transfer characteristic of the circuit of FIG. 4.

The portion of the circuit of FIG. 4 thus far described is responsive to an analog input signal $E_I$ to produce the digital output signal $E_D$ as shown in FIG. 5. Thus, assuming the circuit of FIG. 4 to constitute stage 1, the analog input signal $E_{I1}$ of FIG. 2, line (*a*), will be applied to stage input terminal 100 to produce the digit signal $E_{D1}$ shown in FIG. 2, line (*b*), at output terminal 110.

More particularly, consider the signal $E_I$ as shown in FIG. 5 varying, e.g., between 0 volts and +8 volts. Assume the reference voltage applied to trimming resistor R2 to be approximately −4 volts. Accordingly, when signal $E_I$ is at 0 voltage, amplifier 106 will provide an output potential sufficient to provide a feedback current to essentially reduce the differential voltage between terminals 104 and 108 to 0. Assuming the closed loop gain of amplifier 106 to be 2, a +8 volt potential will be provided at amplifier output terminal 110. At the other extreme, when the input signal $E_I$ is +8 volts, the amplifier 106 will provide a negative output signal of −8 volts in order to reduce the differential input voltage to 0. It should also be appreciated that, when the analog input signal level is at about +4 volts, the amplifier 106 will provide approximately a ground potential at output terminal 110.

It will be noted that the digit output signal $E_D$ provided at output terminal 110 and represented in FIG. 5 is not strictly linear, but includes a notch portion 120. This is accounted for by the drop across diodes D1 and D2. That is, when the level of the analog input potential is close to +4 volts, neither the diode D1 nor the diode D2 will be forward biased. As a consequence, the feedback path around amplifier 106 will be open and the amplifier output signal $E_D$ will vary substantially for small changes in the amplifier input signal $E_I$.

Sense apparatus (not shown) will be coupled to the output terminal 110 by digit line 112 to detect whether the digit provided by that stage is a "1" or a "0" in accordance with the criteria previously mentioned in conjunction with FIG. 2. The notch portion 120 of the characteristic of signal $E_D$ facilitates the sensing of the signal polarity inasmuch as the signal very rapidly switches from positive to negative and vice versa. The circuit apparatus shown to the right of the digit line 112 in FIG. 4 forms the residual analog output signal $E_R$, having the V-shaped characteristic shown in FIG. 5, from the signal $E_D$. More particularly, the output terminal 110 is connected through a diode D3 to the first terminal 130 of a differential amplifier 132. The terminal 130 is connected through a relatively low impedance resistor R5 to ground. Additionally, the output terminal 110 is connected through diode D4 and resistor R4 to a second terminal 134 of differential amplifier 132. The output terminal 136 of amplifier 132 is connected through a feedback resistor R6 to the input terminal 134. The output terminal 136 of amplifier 132 is connected to the stage output terminal 102.

In the operation of the circuit of FIG. 5, the differential amplifier 132 functions in a noninverting mode for positive values of input signal $E_D$ and in an inverting mode for negative values of signal $E_D$. More particularly, consider that signal $E_D$ is positive. Thus, diode D3 is forward biased and diode D4 is back biased. Thus, the feedback loop through resistor R6 is open and amplifier 132 merely comprises a unity gain amplifier. Thus, the first half of the V-shaped characteristic of signal $E_R$shown in FIG. 5 approximates the positive portion of the characteristic of signal $E_D$. If the diodes D1 and D3 (and the diodes D2 and D4) are properly matched, the signal $E_R$ will not be notched as the signal $E_D$ is at 120. Diode matching is made less critical by making R3=R4=R5. The resulting degree of match will be satisfactory at any temperature and for any signal level.

When the signal $E_D$ is negative, the diode D3 will be back biased and the diode D4 will be forward biased. The input terminal 130 of amplifier 132 will be essentially grounded through the resistor R5 which comprises a relatively low impedance compared to the very high input impedance of amplifier 132. Thus, resistor R5 effectively shorts terminal 130 to ground. Accordingly, amplifier output terminal 136 will feed a current back to input terminal 134, tending to maintain it at ground potential.

It should be appreciated that in the converter of FIG. 3, wherein all of the stages are connected in cascade, the data output rate of the converter is dependent upon the propagation time through all of the converter stages. Thus, for example, the output data rate of a converter having 10 stages (i.e., a 10-bit resolution) will be approximately half that of a converter having five stages (i.e., a 5-bit resolution). The present invention enables the provision of converters having output data rates which are independent of the bit resolution and which are limited only by the delay introduced by a single stage, rather than by the cumulative delay of a plurality of stages, as in FIG. 3. Briefly, the present invention is based on the recognition that once a converter stage has completed working on a first analog input word, it can immediately thereafter, and prior to the first word completely propagated through all of the stages, start processing a succeeding analog input word.

Attention is now called to FIG. 6 which illustrates a block diagram of a preferred embodiment of the invention for converting analog input signals to digital output signals. Although the embodiment of FIG. 6 illustrates a converter for producing 5-bit digital output signals, converters of substantially any length can be provided in accordance with the invention to achieve any desired bit resolution. The converter of FIG. 6 can be considered as being comprised of a converting portion 200 shown to the left of the dotted line 202 and an assembling portion 204 shown, to the right of the dotted line 202. The converting portion is illustrated as being comprised of channels A and B, each comprised of N, herein five, substantially identical converter stages 206. As will be seen hereinafter, each converter stage 206 is capable of operating in an "acquisition"mode in which the input portion of the stage slews to, and tracks, the input voltage applied to the stage. Each stage is also capable of operating in a "hold" mode in which the input portion of the stage stops tracking and holds constant the input level at whatever it was immediately prior to the start of the hold command. The level of this held signal is sensed to quantize the output digit while the stage output portion concurrently processes the held input signal to develop an analog residue signal which is coupled to a succeeding stage.

More particularly, the stages of channel A of the converting portion 200 are respectively identified as 1A, 2A, 3A, 4A and NA. Similarly, the stages of channel B are respectively identified as 1B, 2B, 3B, 4B and NB. Each stage includes an analog input terminal, I, an analog residual output terminal, R, and a digital or bit output terminal D. Additionally, each stage includes a hold input terminal, H.

The analog input terminal 208 of the converter is coupled to the analog input terminals, I, of the most significant bit stages 1A and 1B of both converter channels. The analog residual output terminals, R, of both stages 1A and 1B are respectively coupled to the analog input terminals, I, of stages 2A and 2B respectively. Similarly the residual output terminals, R, of stages 2A and 2B and the succeeding stages are respectively coupled to the I input terminals of the immediately succeeding stages. The residual output terminals R, of the last stages in each channel are not utilized.

Alternate stages in each channel are connected to alternating sources of clock pulses. More particularly, a toggle flip-flop 210 is provided which is driven by the output of clock pulse source 212. In response to each pulse provided by source 212, the flip-flop 210 will switch from its present state to an opposite state. Thus, it will alternately supply pulses on output lines 214 and 216. Output line 214 is connected to the hold input terminal H of each of stages 1, 3 and N of channel A. Output terminal 216 of flip-flop 210 is connected to the hold input terminal H of stages 2 and 4 of channel A. In an opposite manner, output terminal 216 is connected to the hold input terminal H of stages 1, 3 and N of channel B and output terminal 214 is connected to the hold input terminal H of stages 2 and 4 of channel B.

As has been previously pointed out, the stages 206 are each capable of operating in an acquisition mode and a hold mode. Each stage will operate in the acquisition mode except when an input pulse is applied to the hold input (H) terminal thereof. Thus, when toggle flip-flop 210 is defining an odd state, stages 1, 3 and N of channel A will be in the hold mode and stages 2 and 4 thereof will be in the acquisition mode. At the same time, stages 2 and 4 of channel B will be in the hold mode and stages 1, 3 and N thereof will be in the acquisition mode.

When state 1A goes into the hold mode, as will be seen hereinafter, the input section thereof samples and holds the level of analog input signal applied to the analog input (I) terminal thereof. Based on the level of the held signal, the stage makes a bit decision and provides either a "1" or "0" signal on its digit output (D) terminal. Simultaneously, the stage forms a residual analog signal on its output terminal R. During the hold interval of stage 1A, stage 2A is in the acquisition mode tracking the signal applied to its I input terminal. When flip-flop 210 changes state, stage 2A switches to a hold mode and stage 1A to an acquisition mode. Thus, stage 2A will operate on the residual analog signal previously developed by stage 1A to in turn provide a residual analog output signal and a bit output signal. Thus, it should be apparent that based on a single sampled level of the analog input signal applied to converter input terminal 208, the stages 1A–NA of channel A will, in order of decreasing significance, successively develop bit output signals. It should also be apparent that during the hold interval of stage 2A, stage 1A is in the acquisition mode tracking a subsequent analog input signal applied to the converter input terminal 208. When the flip-flop 210 changes state to again force stage 1A into the hold mode, stage 1A will provide a bit output signal constituting the most significant bit with respect to a succeeding analog input word. The assembling portion 204 of the converter accepts the bit output signals provided thereto in time sequence, and presents them in parallel to an external system. More particularly, in order to assemble the bits corresponding to a single analog input word in parallel, it is necessary to delay the earlier developed bits until the least significant bit is available from the Nth stage. Assuming a 5-bit resolution as shown in FIG. 6, it is therefore necessary to delay the bits provided by the most significant state 1A by at least four time intervals as compared to the generation of bits by the fifth or least significant stage NA. In order to do this, the bit output terminal D of each of the stages is connected to the input of a shift register whose length is dependent upon the significance of the converter stage connected thereto. Thus, as shown in FIG. 6, the bit output terminal of stage 1A is connected the input of a shift register 220 comprised of five shift stages. The output of the register 220 is coupled to the most significant bit stage of the digital output register 222. The bit output terminal of stage 2A is connected to the input of a four stage shift register 224. Similarly, the bit output terminals of stages 3A, 4A, and NA are connected through shift registers 226, 228, and 230 to appropriate stages of the output register 222.

From what has been said thus far with respect to the embodiment of FIG. 6, it should be appreciated that the digital output register 222 will form a new digital output word in response to every other pulse provided by source 212. In other words, a new digital word will be completed each time stage NA is shifted into the hold mode. Thus, whereas the converter of FIG. 3 is speed limited by the cumulative propagation time through all of the stages, the converter of FIG. 6 is speed limited only by the propagation delay of the single stage.

Although a significant increase in output data rate, as compared to the converter of FIG. 3 can be achieved by employing only channel A of FIG. 6, a further significant output data rate increase can be achieved by operating the stages of channel B alternately with the stages of corresponding significance in channel A. That is, as has been seen, when stage 1A is operating in the hold mode, stage 1B is operated in the acquisition mode. Thus, stage 1B will provide a bit output signal to shift register 220 during each clock period immediately succeeding a clock period during which stage 1A provides a bit output signal. Thus, whereas stage NA will provide a bit output signal to complete a new digital output word during each odd clock period defined by flip-flop 210, stage NB will provide a bit output signal to complete a new digital word during each even clock period. Thus, with the channels A and B operating together as is shown in FIG. 6, the output register 222 will provide a new digital output word for every clock pulse provided by source 212.

The stages 206 employed in the converter of FIG. 6 are preferably similar to the stages illustrated in FIG. 4 but, however, include sample and hold means for enabling operation of the stage in the hold mode. Attention is now called to FIG. 7 which illustrates a preferred embodiment of stage 206. The circuitry distinguishing the stage 206 from the stage of FIG. 4 is enclosed within the dotted box 240.

It will be recalled from the explanation of FIG. 4 that an input signal $E_I$ is applied to an I input terminal designated in FIG. 7 as 100'. The input terminal 100' is connected through resistor R1' to input terminal 104' of amplifier 16'. Variable resistor R2' connect terminal 104' to a source of reference potential. The second terminal 108' of amplifier 106' is connected to ground.

In order to permit operation of the stage 206 in the hold mode, the output of amplifier 106' is connected to the input of an electronic switch 242 whose output is connected to the first terminal of a capacitor 244 whose second terminal is grounded. The first terminal on the capacitor is connected to the input terminal of a buffer amplifier 246. The output terminal of buffer amplifier 246 is utilized in the same manner as the output terminal of amplifier 106 in FIG. 4. That is, the output terminal of amplifier 246 is coupled through diodes D1' and D2' and through resistor R3' to the amplifier input terminal 104'. From what has been previously said with respect to FIG. 4, it will be appreciated that the buffer amplifier 246 will provide an output signal $E'_D$ corresponding to the signal $E_D$ shown in FIG. 5. This signal of course provides the bit output information. Additionally, the signal $E'_D$ is coupled through a stage output portion substantially identical to that shown in FIG. 4 for developing a residual analog output signal $E'_R$. More particularly, the stage output portion is comprised of diode D3' connecting the output terminal of amplifier 246 to the input terminal 130' of differential amplifier 132'. Diode D4' connects the output terminal of amplifier 246 through resistor R4' to input terminal 134' of differential amplifier 132'. Resistor R5' connects input terminal 130' to ground. Resistor R6' couples the output terminal of amplifier 132' to the input terminal 134' thereof.

The state of the electronic switch 242 is controlled by the application of a hold signal by flip-flop 210 to the H input terminal 250 coupled directly to the electronic switch 242. When the electronic switch 242 defines a closed state, the voltage on the first terminal of capacitor 244 will essentially follow the input voltage $E_I$. However, when flip-flop 210 switches the switch 242 to an open state, it will isolate capacitor 244 and cause it to hold the level applied thereto immediately preceding the hold command. Buffer amplifier 246 will therefore produce an output signal $E'_D$ whose level is dependent upon the signal level held by the capacitor 244. A bit detector 260 continually monitors the output signal $E'_D$ and makes the decision whether the level thereof represents a "1" or "0" bit. This determination is made on the basis of the criteria set forth in connection with FIG. 2. The state of the bit detector 260 is, however, strobed and passed out of the stage only in response to a hold command signal provided by flip-flop 210. That is, the output of bit detector 260 is coupled to the input of AND gate 262 which is enabled by the application of the hold command signal to input terminal 250. Thus, AND gate 262 will provide a bit output signal $E_B$ on the digit output terminal 264.

While in the hold mode, the level of the residual analog output signal $E'_R$ developed by the stage of FIG. 7 will remain constant. As should now be appreciated this residual output signal is applied to a succeeding stage which will subsequently go into the hold mode to independently develop a bit output signal and residual output signal based upon the residual output signal $E'_R$ provided thereto by the stage of FIG. 7.

Figure 8:
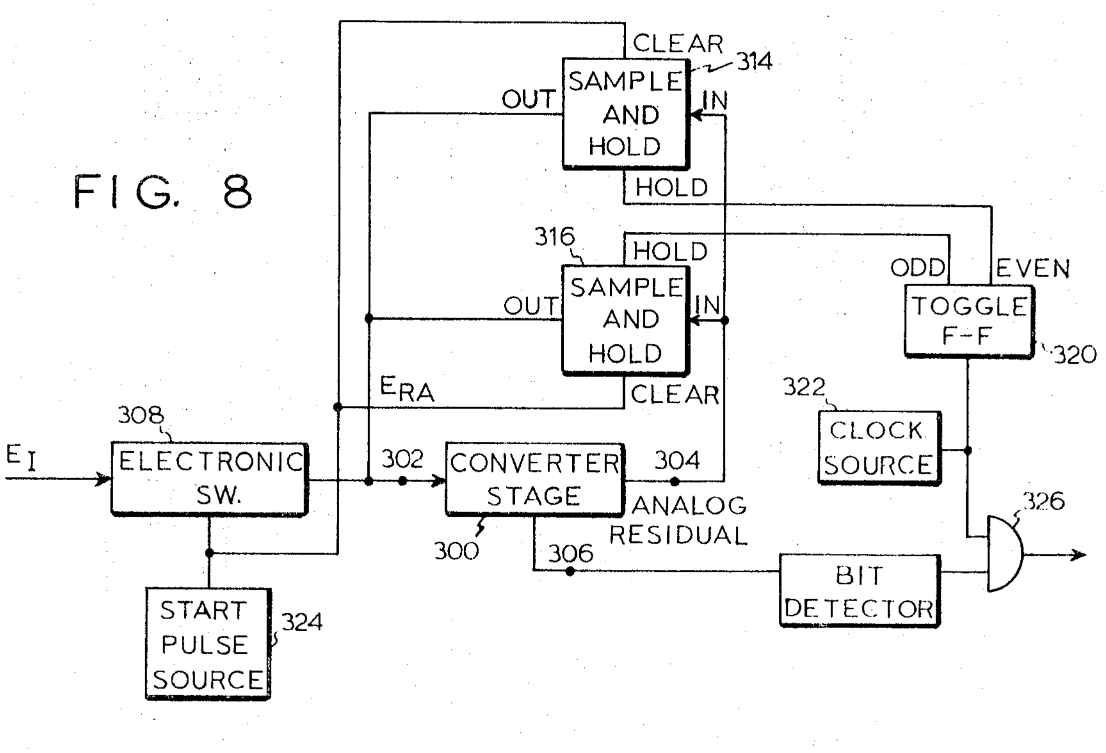
FIG. 8 is a block diagram of an alternative embodiment of the invention.

Attention is now called to FIG. 8 which illustrates a block diagram of an alternative embodiment of the invention in which a single converter stage 300 is iteratively operated at a high duty cycle. The stage 300 of FIG. 8 can be substantially identical to the stage illustrated in FIG. 4. Thus, stage 300 will include an analog input terminal 302, a residual analog output terminal 304, and a bit output terminal 306.

It will be recalled that the stage 300 is characterized by the ability to independently form both a bit output signal and a residual analog output signal in response to an applied analog input signal. That is, the level of the residual analog output signal is independent of the state of the data bit being formed by the stage. The use of the converter stage 300 in the embodiment of FIG. 8 is based on the recognition that once the stage has formed a residual analog output signal and a bit output signal in response to an applied analog input signal, it has completed its function and is free during a succeeding time period to perform the same function with respect to a succeeding analog input signal. Thus, by storing the residual analog output signal from the converter stage during one time interval in a sample and hold circuit, for example, and applying the stored residual analog signal to the input of the converter stage during a succeeding time period, the converter stage can iteratively operate to successively produce data bits to substantially any resolution desired, dependent of course upon such factors as noise levels.

Considering the embodiment of FIG. 8 in greater detail, an original analog input signal $E_I$ can be applied to the converter stage input terminal 302 through an electronic switch 308. Alternatively, residual analog signals $E_{RA}$ can be applied to the converter stage input terminal 302 from the output terminals of sample and hold circuits 314 and 316. The sample and hold circuits 314 and 316 are alternatively operated in acquisition and hold modes determined by the stage of a toggle flip-flop 320 driven by a clock pulse source 322. More particularly, when the toggle flip-flop 320 defines an odd state, sample and hold circuit 316 will operate in its hold mode while circuit 314 will operate in the acquisition mode. On the other hand, when toggle flip-flop 320 switches to an even state, sample and hold circuit 314 will switch to the hold mode and sample and hold circuit 316 will switch to the acquisition mode. The converter stage analog residual output terminal 304 is connected to the input terminals of the sample and hold circuits 314 and 316.

In order to understand the operation of the embodiment of FIG. 8, assume the application of an original analog input signal $E_I$ to the electronic switch 308. In response to a start pulse provided by source 324, switch 308 will couple the signal $E_I$ to converter stage input terminal 302. The pulse provided by source 324 will additionally clear the sample and hold circuits 314 and 316. In response to the input signal applied to its terminal 302, the converter stage 300 will essentially simultaneously produce a residual analog output signal on its terminal 304 and a data bit output signal on its terminal 306. Assume, for example, that the toggle flip-flop 320 defines an odd state meaning that the sample and hold circuit 314 is tracking the residual output signal available at terminal 304. When a clock pulse is provided by source 322, toggle flip-flop 320 will switch to an even state to thus switch circuit 314 to the hold mode to thereby couple the level of the residual analog output signal available at terminal 304 immediately prior to flip-flop 320 switching, to the input terminal 302 of converter stage 300. In response to the residual analog input signal $E_{RA}$ applied to the terminal 302, the stage 300 will in turn produce a new residual analog signal at the terminal 304 which will now be tracked by sample and hold circuit 316. Concurrently the stage 300 will produce anew data bit on its output terminal 306. In response to the next pulse provided by source 322, the toggle flip-flop 320 will again change state thus forcing sample and hold circuit 316 into a hold mode to thereby couple the new residual analog output signal available at terminal 304 immediately prior to the flip-flop 320 switching, to the input terminal 302 of converter stage 300.

The provision of each clock pulse by source 322 enables gate 326 to thus serially output data bits from the converter of FIG. 8, It should be recognized that the converter stage 300 can be operated in the aforedescribed manner through substantially any number of iterations to achieve the resolution desired.

From the foregoing explanation of the embodiment of FIG. 8, it should be recognized that data bits can be serially derived therefrom at a rate substantially commensurate with the derivation of bits from the tandem stage converter of FIG. 3 in which the residual analog signals essentially ripple or propagate through a series of stages connected in tandem.

Figure 9:
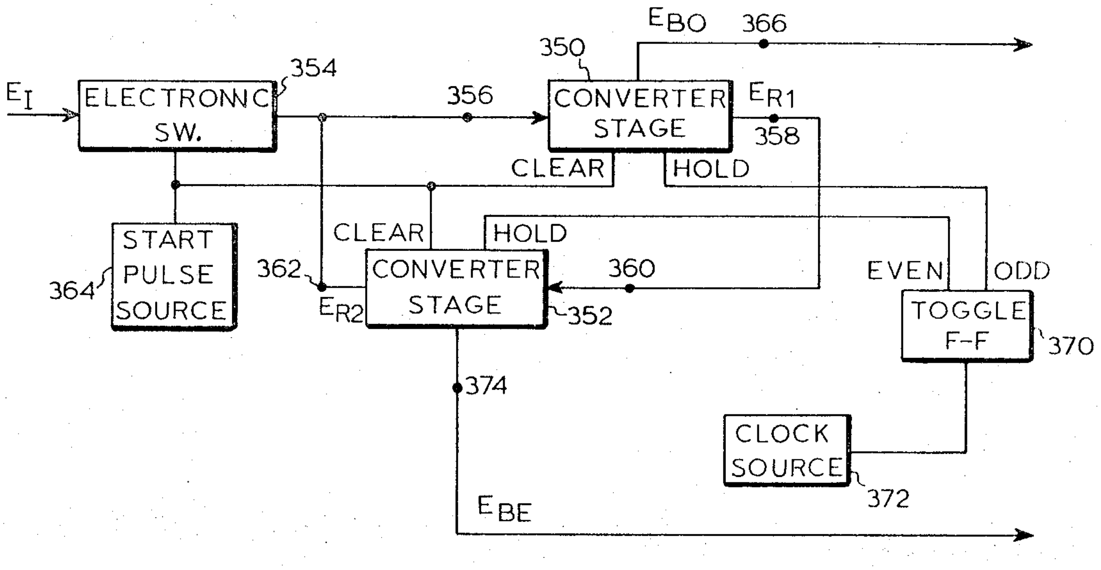
FIG. 9 is a block diagram of a variation of the embodiment of FIG. 8.

It should be recognized that the embodiment of FIG. 8 can be further modified to utilize, for example the converter stage of FIG. 7 in which the sample and hold capability is incorporated within the circuitry of the converter stage. More particularly as shown in FIG. 9, converter stages 350 and 352 are utilized, each substantially corresponding to the circuitry as shown in FIG. 7. An original analog input signal $E_I$ is coupled through electronic switch 354 to the input terminal 356 of stage 350. The stage 350 develops a residual analog output signal $E_{R1}$ on its output terminal 358 which in turn is coupled to the input terminal 360 of converter stage 352. Stage 352 develops a residual analog output signal $E_{R2}$ an output terminal 362 which in turn is connected to input terminal 356 of stage 350. Start pulse source 364 is connected to the switch terminal of switch 354 and to clear input terminals of stages 350 and 352. Provision of a pulse from source 364 momentarily closes switch 354 to apply the input signal $E_I$ to the converter stage 350. The pulse provided by source 364 additionally initially discharges the storage capacitor in each of the converter stages 350 and 352. As previously pointed out, the stages 350 and 352 are each capable of operating in a hold mode and in an acquisition or tracking mode as determined by the state of a toggle flip-flop 370. That is, when the flip-flop 370 defines an even state, stage 352 will operate in the hold mode and stage 350 in the acquisition mode. When flip-flop 370 defines an odd state, stage 350 will be in the hold mode and 352 in the acquisition mode.

In operation assume initially that stage 350 is in the tracking mode and that switch 354 closes to apply input signal $E_I$ to stage input terminal 356. Also assume that flip-flop 370 now switches to the hold mode to thus provide a data bit output signal $E_{BO}$ on its output terminal 366 as well as a residual analog output signal $E_{R1}$ on its output terminal 358. When the next clock pulse is provided by source 372, flip-flop 370 will change state thus switching stage 352 to a hold mode and producing data bit output signal $E_{BE}$ on stage output terminal 374 and residual analog output signal $E_{R2}$ on stage output terminal 362. Thus it will be appreciated that the converter stages 350 and 352 will alternately provide data bit output signals $E_{BO}$ and $E_{BE}$ during odd and even periods as defined by the state of the toggle flip-flop 370. As was true in the embodiment of FIG. 8, the stages 350 and 352 of FIG. 9 can be iteratively operated through any number of cycles to achieve a desired bit resolution.

From the foregoing, it s should be appreciated that analog-to-digital converter embodiments have been disclosed herein in which the converter stages thereof have been operated at substantially maximum duty cycles in order to achieve either an extremely high output data rate or a minimization of required hardware.

The embodiments of the invention in which an exclusive property or privilege is claimed are defined as follows:

1. An analog-to-digital converter comprising:
a converter input terminal;
a series of N substantially identical converter stages including first and last stages and one or more intermediate stages, each of said stages having an analog input terminal, a bit output terminal, and a residual analog output terminal
means connecting said converter input terminal to said first converter stage analog input terminal;
means connecting each of said first and intermediate stage residual analog output terminals to the analog input terminal of a succeeding converter stage;
source means for providing successively occurring clock pulses;
coupling means for coupling clock pulse from said source to said stages in a manner so as to alternately pulse the stages of said series of converter stages.
each of said converter stages being switchable between first and second operating modes in response to clock pulses applied thereto, each stage being operative when in said first mode to slew to and track its applied input signal and being operative when in said second mode to concurrently independently produce a bit output signal and a residual analog output signal in response to the value of the tracked signal at that time.

2. The converter of claim 1 including an output register comprised of N bit stages each corresponding to a different one of said converter stages, each of said converter stage bit output terminals being connected to the output register stage corresponding thereto by a different clocked delay means.

3. The converter of claim 2 wherein each of said different clocked delay means delays the propagation of a signal applied thereto by a different time interval.

4. The converter of claim 1 wherein each of said stages includes means responsive to a signal applied thereto whose level lies within a predetermined range for determining whether or not said level exceeds the midpoint of said range.

5. The converter of claim 1 wherein each of said stages includes means responsive to a signal applied thereto whose level lies within a predetermined range for providing a residual analog signal at the stage residual analog output terminal whose level is proportional to the absolute difference between the level of said applied signal and the midpoint of said range.

6. The converter of claim 1 including a second series of N converter stages, each substantially identical to said stages of the first recited series and each corresponding in bit significance to a different stage of said first recited series; and
wherein said coupling means further includes means for coupling clock pulses from said source to the stages of said second series in a manner so as to alternatively pulse the stages thereof and also so that corresponding stages in said first and second series are alternately pulsed.

7. An analog-to-digital converter comprising:
a converter input terminal;

a series of N substantially identical converter stages including first and last stages and one or more intermediate stages, each of said stages having an analog input terminal, a bit output terminal, and a residual analog output terminal;

means connecting said converter input terminal to said first converter stage analog input terminal;

means connecting each of said first and intermediate stage residual analog output terminals to the analog input terminal of a succeeding converter stage;

source means for providing successively occurring clock pulses;

means coupling said clock pulses to said converter stages so as to provide alternate pulsing thereof;

each of said converter stages including hold means responsive to the application of a clock pulse applied thereto for sampling and storing the signal level applied to the analog input terminal thereof;

each of said converter stages further including bit detection means for determining whether said stored signal level exceeds a preestablished threshold level and for providing a bit output signal to the bit output terminal thereof in response to said determination;

each of said converter stages further including residual signal generation means responsive to the stored signal level and operating independently of said bit detection mean for concurrently providing a residual analog signal to the residual analog output terminal thereof proportional to the absolute difference between the level of said applied signal and said threshold level.

8. The converter of claim 7 including an output register comprised of N bits stages each corresponding to a different one of said converter stages, each of said converter stage bit output terminals being connected to the output register stage corresponding thereto by a different clocked delay means.

9. A converter stage switchable between first and second operating modes for converting an analog signal within a predetermined range to reflected binary code signals, said converter stage operable in response to applied trigger pulses for providing first and second operating modes for said stage such that the stage is operative when in said first mode to slew to and track an applied analog input signal and is operative when in said second mode to concurrently and independently produce a bit output signal and a residual analog output signal in response to the value of the tracked signal at that time including a stage input terminal;

a stage output terminal;

circuit means connected to said stage input terminal and said circuit means including first means responsive to a trigger pulse for sampling and storing the level of signal available at said stage input terminal;

said circuit means also including second means for inverting stored signal levels extending in a first direction from the midpoint of said predetermined range and for directly coupling without inversion stored signal levels having a level extending in a second direction form said midpoint;

said second means including a differential amplifier having first and second amplifier input terminals and an amplifier output terminal; and coupling means coupling said stored signal level to said first and second amplifier input terminals and said amplifier output terminal to said stage output terminal.

10. An analog-to-digital converter for converting an analog signal within a predetermined range to reflected binary code signals, said converter comprising:

a converter input terminal;

at least one converter stage having an analog input terminal, a residual analog output terminal, and a digital output terminal; and iterative means for providing iterative operation of said stage in response to an input analog signal, said iterative means including switch means coupling said converter input terminal to said stage analog input terminal;

said iterative means also including analog storage means coupling said stage analog output terminal to said stage analog input terminal;

said stage including circuit means coupling said stage analog input terminal to said stage residual analog output terminal for inverting analog signal levels extending in a first direction from the midpoint of said predetermined range and for directly coupling without inversion analog signal levels extending in a second direction from said midpoint.

11. The converter of claim 10 wherein said circuit means includes a differential amplifier having first and second amplifier input terminal and an amplifier output terminal; and coupling means coupling said stage analog input terminal to said first and second input terminals and said amplifier output terminal to said stage residual analog output terminal.